United States Patent [15] 3,693,027
Garaway [45] Sept. 19, 1972

[54] ZERO CROSSING DETECTOR

[72] Inventor: Mark W. Garaway, Allison Park, Pa.

[73] Assignee: Westinghouse Electric Corporation, Pittsburgh, Pa.

[22] Filed: Sept. 30, 1971

[21] Appl. No.: 185,200

[52] U.S. Cl. ......................307/133, 323/21, 323/100
[51] Int. Cl. .........................H03k 17/60, H03k 17/72
[58] Field of Search....307/133, 252 UA; 323/16, 17, 323/18, 19, 21, 100

[56] References Cited

UNITED STATES PATENTS

| | | | |
|---|---|---|---|
| 3,335,291 | 8/1967 | Gutzwiller | ...........307/133 UX |
| 3,450,891 | 6/1969 | Riley | .........................307/133 |

*Primary Examiner*—A. D. Pellinen
*Attorney*—F. H. Henson et al.

[57] ABSTRACT

A zero crossing detector for generating a pulse at every other zero crossing of a high voltage alternating current source, incorporating isolation between the high voltage alternating current source and a low voltage logic input with the use of an optically coupled diode-transistor pair.

8 Claims, 2 Drawing Figures

ZERO CROSSING DETECTOR

BACKGROUND OF THE INVENTION

As is known, there are many applications where it is necessary to produce a digital pulse precisely at the zero crossing of an alternating current waveform. The problem is complicated where it is desired to couple a zero crossing detector for a high voltage alternating current line to low voltage logic circuitry, such as that using integrated circuits. Although various circuit arrangements have been proposed for this purpose in the past, most are expensive, require the use of a transformer, dissipate relatively large amounts of power or are otherwise not altogether satisfactory.

SUMMARY OF THE INVENTION

In accordance with the present invention, there is provided a zero crossing detector utilizing the high isolation resistance of an optically coupled diode-transistor pair for generating a low voltage pulse at the zero crossing of a high voltage alternating current waveform, the phototransistor pair comprising a light emitting diode responsive to the high voltage which triggers a phototransistor and a low voltage circuit to produce the low voltage pulse.

Specifically, there is provided means for charging a capacitor during one-half cycle of an applied high voltage alternating current waveform, together with an impedance element and a transistor in shunt with the capacitor. Means are coupled to the base of the transistor for turning it ON during at least the major portion of the aforesaid one-half cycle of the alternating current waveform. The series combination of a silicon controlled rectifier and the light emitting diode portion of a phototransistor coupled pair is connected in shunt with the capacitor; while a connection is provided between the junction of the transistor and the impedance element to the gate electrode of the silicon controlled rectifier whereby the rectifier will conduct to discharge the capacitor through the light emitting diode when the current applied to the base of the transistor during the latter part of the aforesaid one-half cycle falls below a predetermined limit.

When the light emitting diode thus conducts in response to a surge of current from the capacitor, it turns ON the phototransistor portion of the phototransistor coupled pair to produce, in a low voltage circuit, a low voltage pulse which occurs as the input alternating current waveform passes through zero. With the circuit of the invention, a pulse will be produced at every negative going zero crossing of the applied waveform only.

Figure 1:
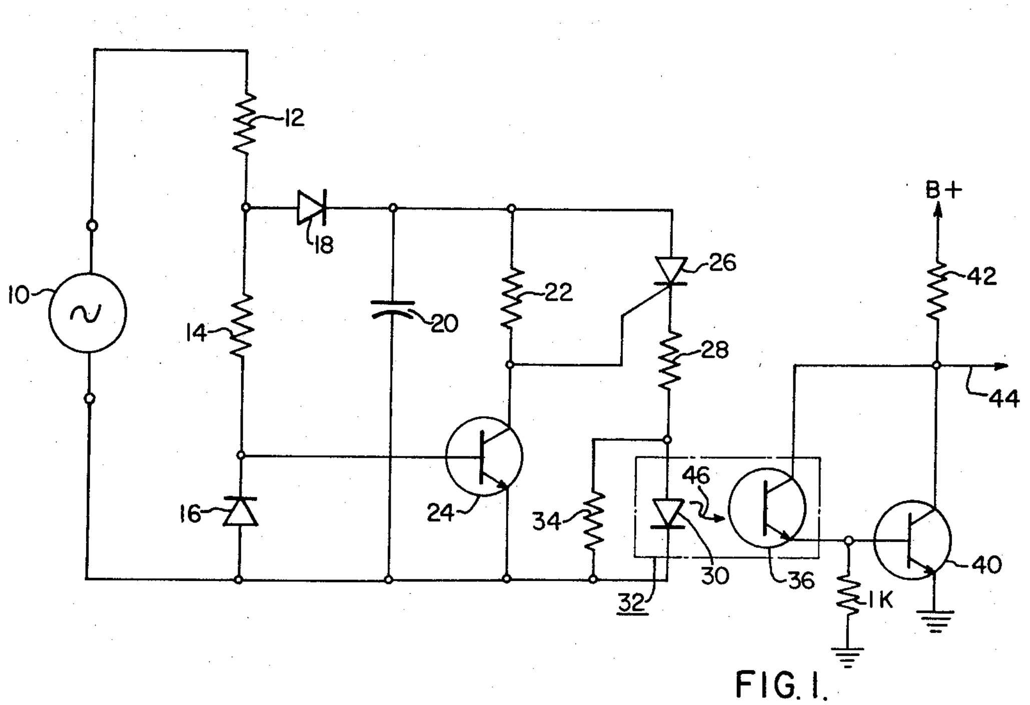

The above and other objects and features of the invention will become apparent from the following detailed description taken in connection with the accompanying drawings which form a part of this specification, and in which:

FIG. 1 is a schematic circuit diagram of one embodiment of the invention; and

Figure 2:
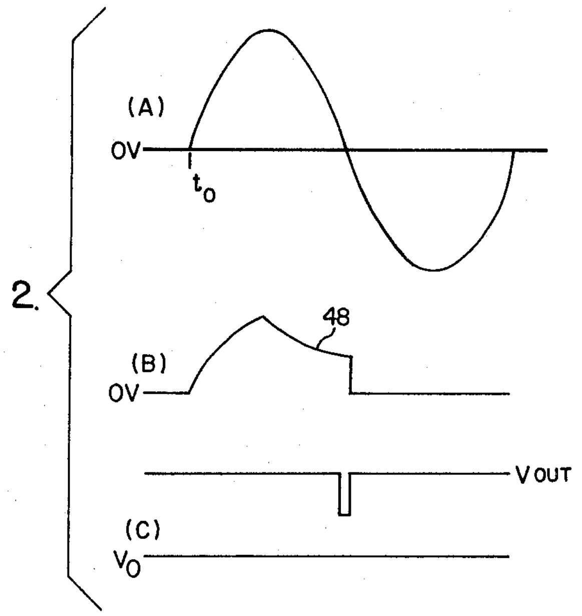

FIG. 2 comprises waveforms illustrating the operation of the circuit of FIG. 1.

With reference now to the drawings, and particularly to FIG. 1, a source of alternating current voltage 10 is shown which may have a voltage level of 120 volts or higher, for example. Connected in shunt with the voltage source 10 is a voltage divider network comprising resistors 12 and 14 in series with diode 16. The junction of resistors 12 and 14, in turn, is connected through diode 18 to the upper terminal of a capacitor 20. The lower terminal of this same capacitor is connected back to one terminal of the alternating current voltage source 10.

In shunt with the capacitor 20 is a resistor 22 in series with the collector and emitter of an NPN transistor 24. The base of transistor 24 is connected, as shown, to the junction of resistor 14 and diode 16 in the voltage divider network. Also connected in shunt with the capacitor 20 is a semiconductive controlled rectifier 26, preferably a silicon controlled rectifier, a resistor 28 and the light emitting diode portion 30 of an optically coupled diode-transistor pair enclosed by broken lines and generally indicated by the reference numeral 32. In shunt with the light emitting diode portion 30 is a resistor 34.

The phototransistor portion 36 of the optically coupled diode-transistor pair has its emitter connected to the base of a second NPN transistor 40 and its collector connected to the collector of the same transistor 40. The emitter of transistor 40 is grounded as shown; while its collector, as well as the collector of the phototransistor portion 36, is connected through load resistor 42 to a source of B+ potential, such as +5 volts. Output signals are derived on lead 44 from the collector of transistor 40.

The phototransistor coupled pair may be of the type identified as MCT—2 manufactured by Monsanto Electronic Special Products of Cupertino, California. It consists of the light emitting diode 30 which, when subjected to a surge of current, will emit light indicated at 46 in FIG. 1 to trigger the phototransistor portion 36. The voltage used to trigger the diode 32 can be relatively high while that used to activate the phototransistor portion 36 relatively low. Additionally, there is exceptionally good isolation resistance between the two, in the order or $10^{11}$ ohms. The output circuit can be used to drive DTL and TTL gates, however any variety of output circuits may be used.

The operation of the circuit can perhaps best be understood by reference to FIG. 2 wherein waveform A represents that across source 10, waveform B represents that across the capacitor 20, and waveform C is the output pulse which occurs at the negative going zero crossing of the waveform A. At time $t_0$ in FIG. 2, capacitor 20 is discharged and the circuit is ready to initiate a new cycle of operation. As the line voltage begins to go positive at time $t_0$, capacitor 20 charges through diode 18 with the polarity shown in FIG. 2. At the same time, transistor 24 begins to conduct and obtains base drive from the junction of resistor 14 and diode 16 through resistor 14. Resistor 22 acts as a load for transistor 24 and keeps capacitor 20 from quickly discharging through the transistor 24, which is now conducting.

As shown by waveform B, capacitor 20 charges to a peak voltage at about 90° after time $t_0$. It then discharges slowly along curve 48 in FIG. 2 through resistor 22 and transistor 24. The transistor 24 continues to conduct until the voltage from source 10 drops below a predetermined value. At this point, the current through transistor 24 is diminished to the point where the current supplied to the gate electrode of the silicon controlled rectifier 26 drives it into conduction. Capacitor 20 now quickly discharge through rectifier 26 supplying current for the light emitting diode portion 30 of the optically coupled diode-transistor pair 32. The result of this action is to provide drive for the phototransistor portion 36 of the device 32, thus turning ON transistor 40 to produce an output pulse appearing as waveform C in FIG. 2. Resistor 28 limits current through the light emitting diode 30; while resistor 34 in shunt with the diode 30 provides a current path to fully discharge capacitor 20.

For different values of voltage from source 10, it is necessary only to change the resistance values of resistors 12 and 14 to provide sufficient charging current for capacitor 20 and line drive for transistor 24.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. Apparatus for detecting a zero crossing of an alternating current voltage source comprising a capacitor, means for charging said capacitor during one-half cycle of said alternating current voltage source, an impedance element and the collector and emitter of a transistor in shunt with said capacitor, means coupled to the base of said transistor for turning it ON during at least the first portion of said cycle of the alternating current voltage source, the series combination of a semiconductive controlled rectifier and the light emitting diode portion of a phototransistor-coupled pair in shunt with said capacitor, means connecting the junction of said transistor and said impedance element to the gate electrode of the semiconductive controlled rectifier whereby the rectifier will conduct to discharge said capacitor when the current applied to the base of said transistor during the latter part of said one-half cycle falls below a predetermined value, and means coupled to the phototransistor portion of said phototransistor-coupled pair for producing a low voltage pulse when said semiconductive controlled rectifier fires to discharge said capaitor.

2. The apparatus of claim 1 wherein said impedance element is in series with said transistor and comprises a resistor.

3. The apparatus of claim 1 including a resistor in series with said semiconductive controlled rectifier and said light emitting diode portion.

4. The apparatus of claim 3 including a resistor in shunt with said light emitting diode portion to insure complete discharge of said capacitor when said semiconductive controlled rectifier fires.

5. The apparatus of claim 1 including a voltage divider comprising a pair of resistors in series with a diode connected across said alternating current voltage source, a diode connecting the junction of said resistors to one terminal of said capacitor, and means connecting the other terminal of said capacitor to one terminal of said alternating current voltage source.

6. The apparatus of claim 5 including a connection between the base of said transistor and the junction of one of said resistors and said diode in said voltage divider.

7. The apparatus of claim 5 wherein the said diode and said semiconductive controlled rectifier are poled such that said low voltage pulse will be produced on the negative-going zero crossing of said alternating current voltage source.

8. The apparatus of claim 1 wherein the means coupled to said phototransistor portion includes a transistor switch having its base and collector connected to the emitter and collector portions respectively of said phototransistor portion.

* * * * *